United States Patent
Wedowski

(10) Patent No.: US 8,633,460 B2
(45) Date of Patent: Jan. 21, 2014

(54) REFLECTIVE OPTICAL ELEMENT, OPTICAL SYSTEM EUV AND LITHOGRAPHY DEVICE

(75) Inventor: Marco Wedowski, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/180,263

(22) Filed: Jul. 11, 2011

(65) Prior Publication Data

US 2011/0261343 A1    Oct. 27, 2011

Related U.S. Application Data

(63) Continuation of application No. 12/357,927, filed on Jan. 22, 2009, now Pat. No. 8,003,960, which is a continuation of application No. 11/257,967, filed on Oct. 25, 2005, now abandoned, which is a continuation-in-part of application No. PCT/EP2004/004368, filed on Apr. 26, 2004.

(30) Foreign Application Priority Data

Apr. 25, 2003    (DE) .................................. 103 19 005

(51) Int. Cl.
*G01J 1/00*    (2006.01)
(52) U.S. Cl.
USPC ...................... 250/504 R; 250/503.1; 355/67
(58) Field of Classification Search
USPC .................................................... 250/504 R
See application file for complete search history.

(56) References Cited

U.S. PATENT DOCUMENTS

| | | | |
|---|---|---|---|
| 3,887,261 A * | 6/1975 | Spiller | ........................... 359/580 |
| 4,958,363 A | 9/1990 | Nelson et al. | |
| 5,911,858 A * | 6/1999 | Ruffner | ..................... 204/192.27 |
| 5,958,605 A | 9/1999 | Montcalm et al. | |
| 6,024,455 A * | 2/2000 | O'Neill et al. | ................ 359/530 |
| 6,157,486 A | 12/2000 | Benson, Jr. et al. | |
| 6,157,490 A * | 12/2000 | Wheatley et al. | ............ 359/589 |
| 6,228,512 B1 | 5/2001 | Bajt et al. | |

(Continued)

FOREIGN PATENT DOCUMENTS

| | | |
|---|---|---|
| EP | 0708367 | 4/1996 |
| EP | 0824721 | 2/1998 |

(Continued)

OTHER PUBLICATIONS

U.S. Appl. No. 11/216,560, filed Oct. 25, 2005, Wedowski, Marco.

(Continued)

*Primary Examiner* — Phillip A Johnston
(74) *Attorney, Agent, or Firm* — Sughrue Mion, PLLC

(57) ABSTRACT

In order to obtain optimal reflectivity on optical elements for the EUV and the soft X-ray range, multilayers constructed of a number of layers are used. Contamination or degradation of the surface leads to imaging defects and transmission losses. In the prior art, it has been attempted to counter a negative change in the surface by providing a cover layer system on the surface of the reflective optical element that should protect the surface. The invention renders the influence of the surface degradation manageable by a targeted selection of the distribution of thickness of the cover layer system, whereby at least one layer of the cover layer system has a gradient that is not equal to zero.

17 Claims, 15 Drawing Sheets

(56) References Cited

U.S. PATENT DOCUMENTS

| 6,937,334 B2 | 8/2005 | Monshouwer et al. |
| 2005/0087699 A1 | 4/2005 | Miyake |
| 2008/0204861 A1 | 8/2008 | Shiraishi |

FOREIGN PATENT DOCUMENTS

| EP | 0922996 | 6/1999 |
| EP | 1186957 | 3/2002 |
| EP | 1260861 | 11/2002 |
| JP | 8-213312 | 8/1996 |
| WO | 03/032329 | 4/2003 |
| WO | 03/32329 A1 | 4/2003 |
| WO | 2004/079753 A3 | 9/2004 |

OTHER PUBLICATIONS

Singh, et al., Capping layers for extreme-ultraviolet multilayer interference coatings, optics letters, optical society of america, washington, XP-002219427, vol. 26, No. 5, pp. 259-261, Mar. 1, 2001.

Malinowski, et al., Controlling Contamination in Mo/Si Multilayer Mirrors by Si Surface-capping Modifications, Proceedings of SPIE vol. 4688, (2002) XP008042287, pp. 442-453.

Oesterreich, et al., Multilayer reflectance during exposure to EUV radiation, Soft e-ray and EUV Imaging Systems, SPIE vol. 4146, XP-002289630, pp. 64-71, 2000.

* cited by examiner

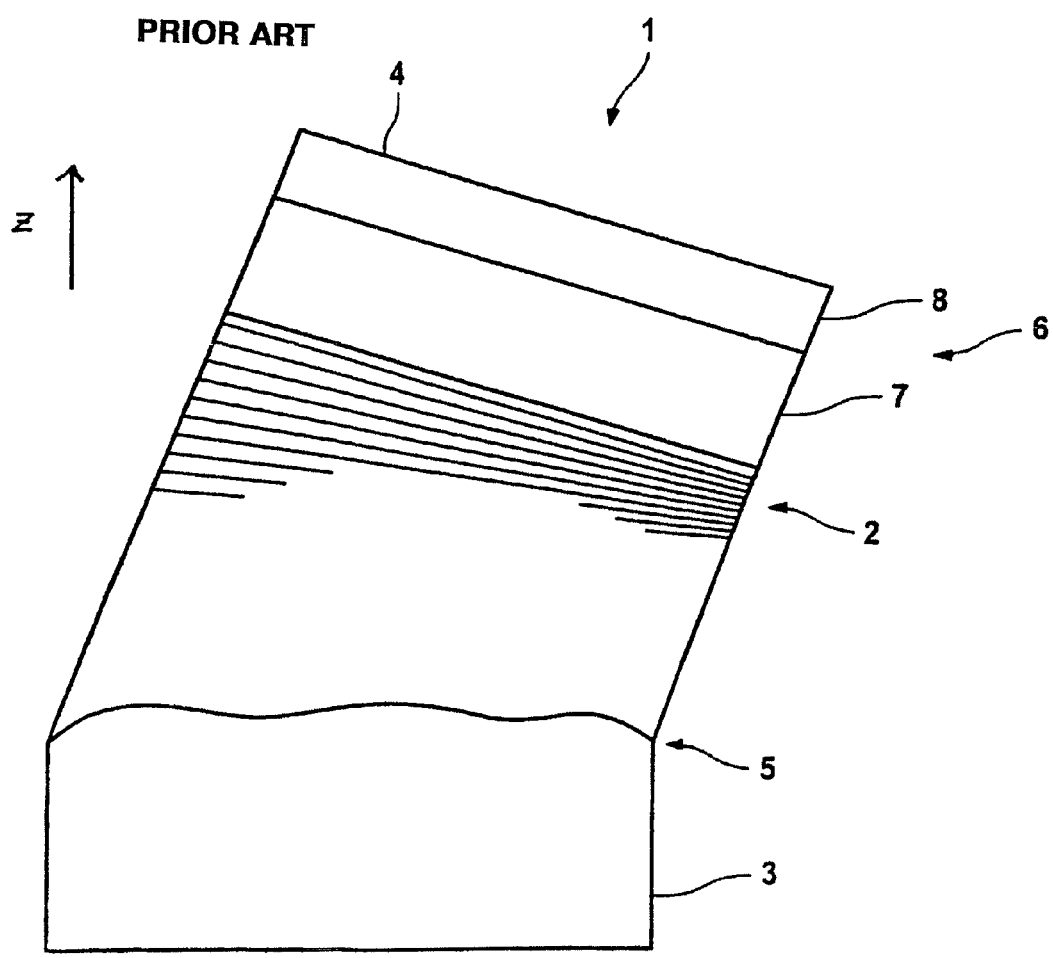

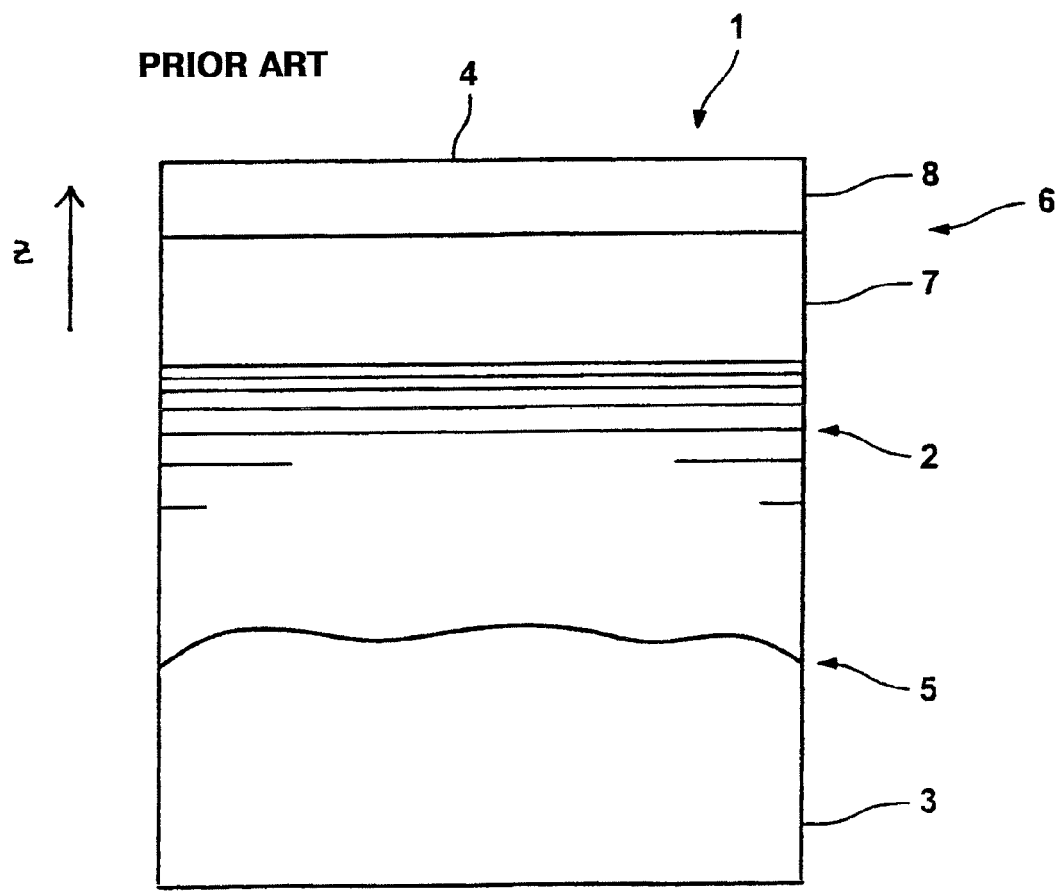

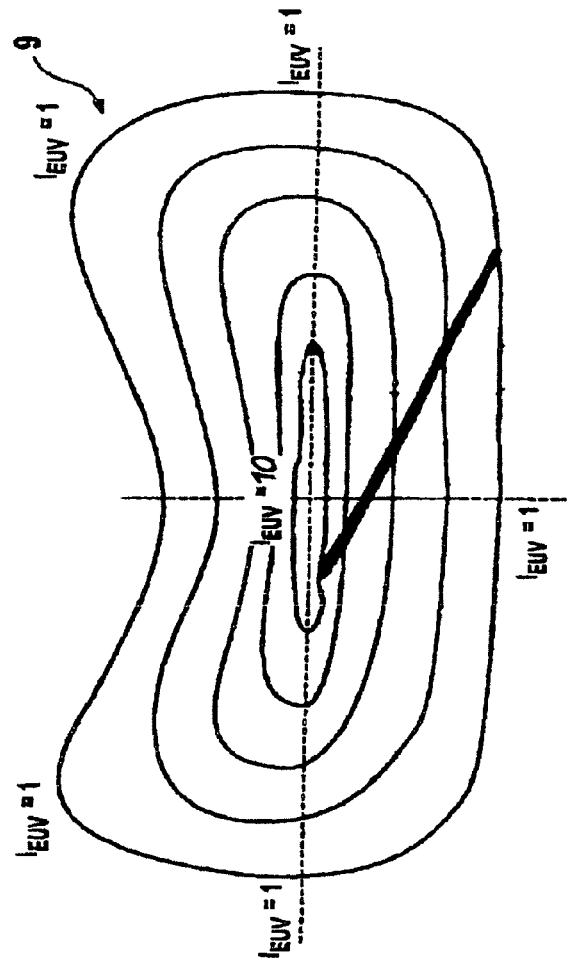
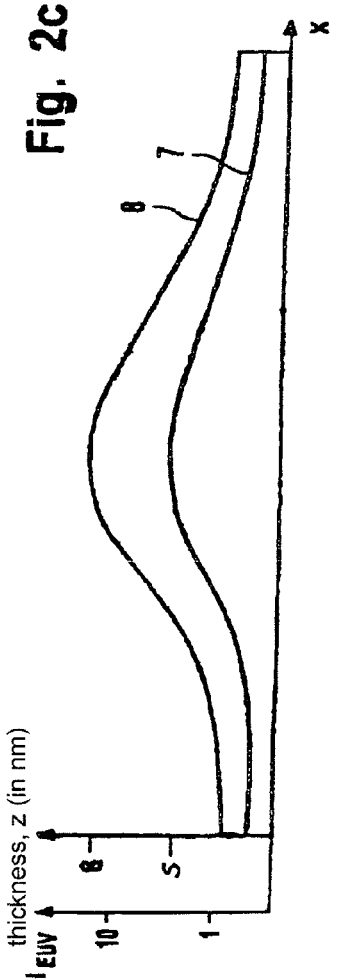
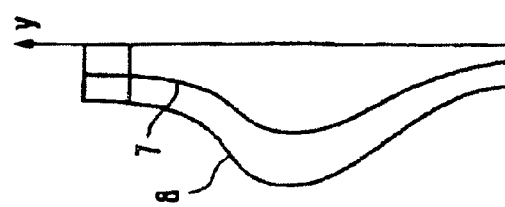
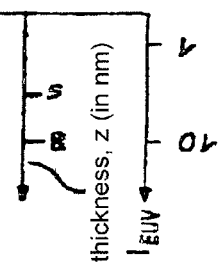

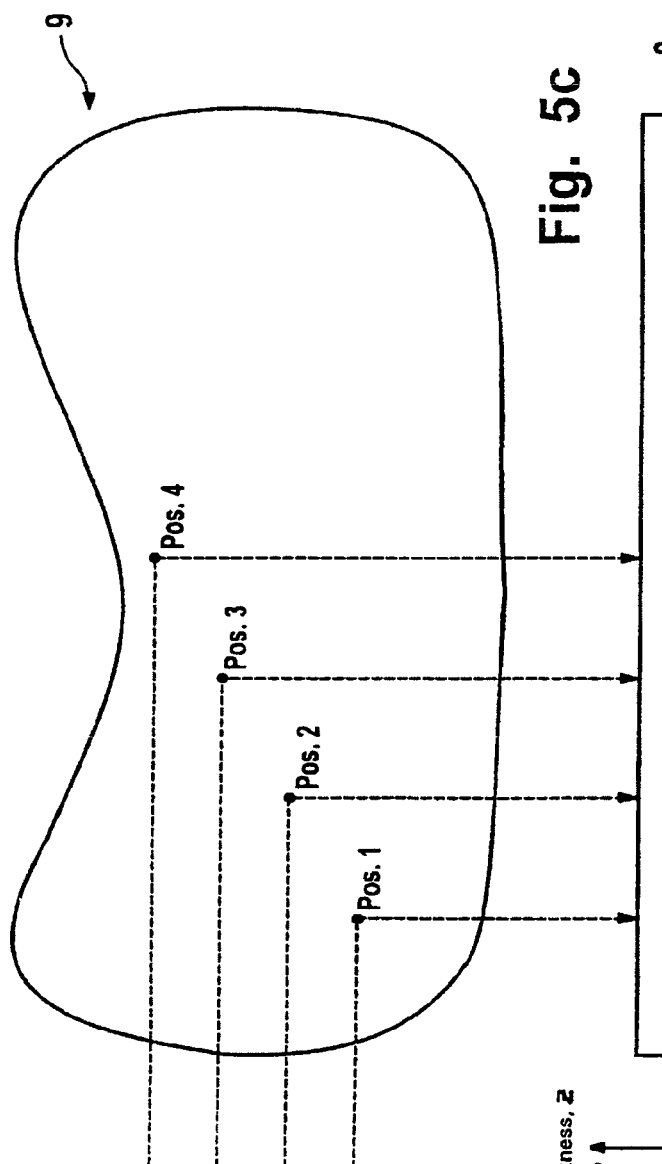
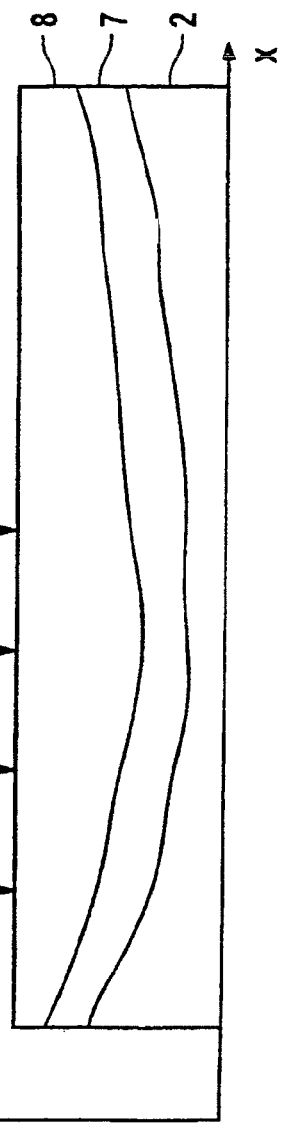
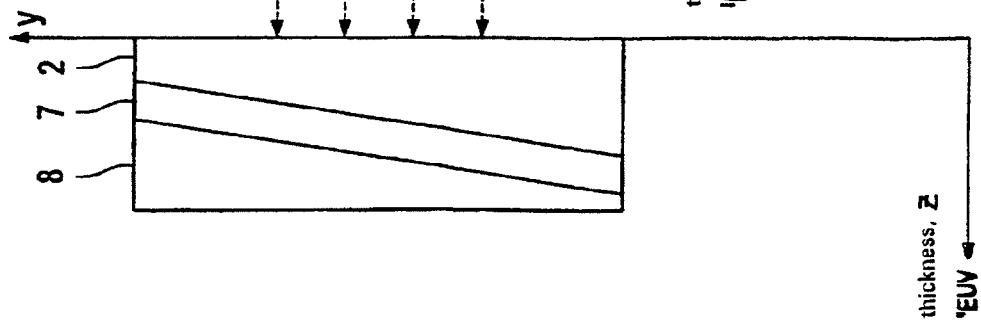

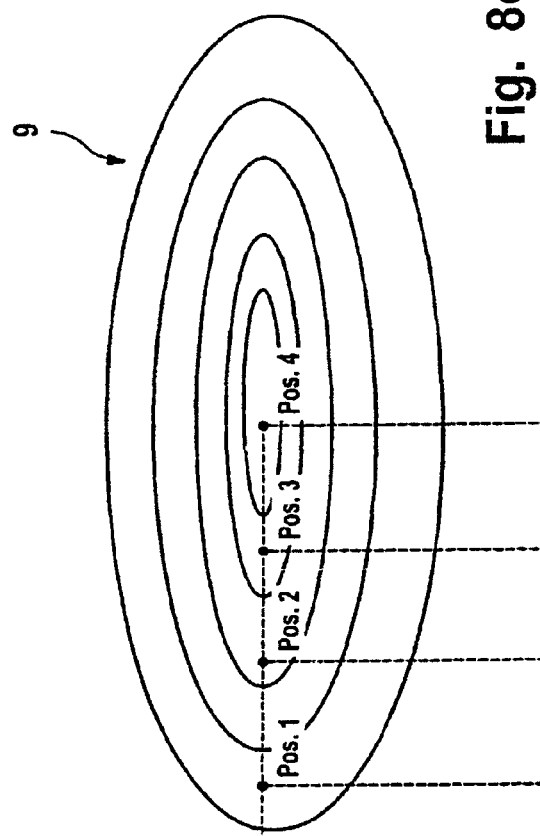
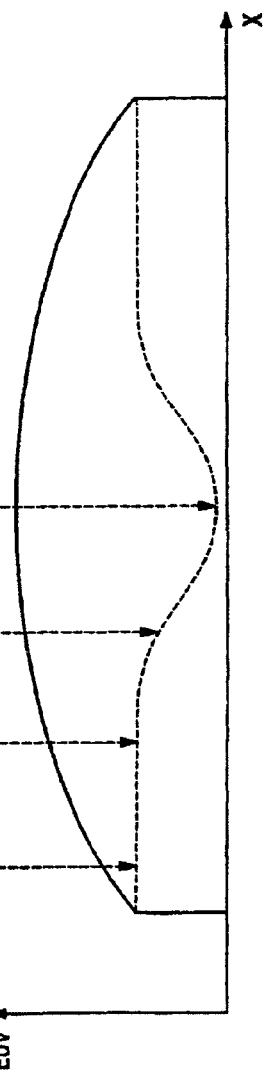
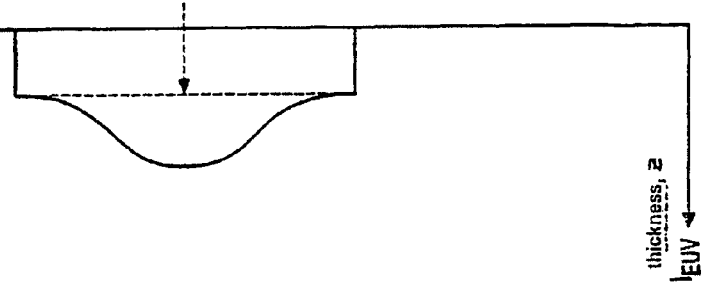
Fig. 8a
Fig. 8c
Fig. 8b

REFLECTIVE OPTICAL ELEMENT, OPTICAL SYSTEM EUV AND LITHOGRAPHY DEVICE

CROSS REFERENCE

This is a Continuation of application Ser. No. 12/357,927 filed Jan. 22, 2009, which is a Continuation Application of application Ser. No. 11/216,560 filed Aug. 31, 2005, which is a Continuation-in-Part Application of PCT Application No. PCT/EP2004/002014 filed Mar. 1, 2004 and published as WO 2004/079753 on Sep. 16, 2004, which claims priority from German Application No. 103 19 005.8 filed Apr. 25, 2003. The entire disclosures of the prior applications are hereby incorporated by reference.

FIELD OF THE INVENTION

The invention concerns a reflective optical element for the extreme ultraviolet and/or soft x-ray wavelength region with a cover layer system having at least one layer, whose spatial structure can be described in a Cartesian system of coordinates (x, y, z) with z=z(x, y). Other systems of coordinates are possible for describing the spatial structure.

Moreover, the invention concerns an optical system or an EUV lithography device with at least two reflective optical elements for the extreme ultraviolet and/or soft x-ray wavelength region with at least one cover layer system.

BACKGROUND OF THE INVENTION

Multilayers composed of a plurality of layers are used to achieve optimal reflectivity on optical elements for the EUV and soft x-ray wavelength region. Such multilayers are composed from periodic repetitions, a period consisting of two layers in the elementary case. As a rule, one layer material should have the highest possible index of refraction and slight absorption, while the other layer material should have the lowest possible index of refraction. The layer with the high index of refraction and slight absorption is also known as a spacer, the layer with low index of refraction is also called an absorber. The period thickness and the thicknesses of the individual layers are chosen such, in dependence on the operating wavelength, the mean angle of incidence, and the angle bandwidth of the incident radiation, that the integrated reflectivity over the illuminated surface is maximized. By a cover layer system is meant the portion of a multilayer coating or an optical element that is no longer periodic and forms a closure at the free interface. In the elementary case, this is merely the last individual layer.

Reflective optical elements are used, for example, in EUV lithography instruments for the production of semiconductor components. In use, they are exposed to both an irradiation of up to 20 mW/mm$^2$ EUV intensity or more, and to a residual gas fraction of water, oxygen and hydrocarbons, as well as other residual gas components. Residual gas components adsorbed onto irradiated surfaces are split up into reactive cleavage products by photoinduced electrons due to bombardment of the surface with EUV photons. This generally leads to a degradation or contamination, e.g., by oxidation, carbon deposits, interdiffusion, material ablation, etc., of the multilayer surface. These effects lead to imaging errors and transmission losses. In the worst case, the desired imaging is totally impossible. Thus, regeneration cycles must be provided during operation of the EUV lithography machine, which not only significantly increase the operating costs, but also in the extreme case lead to an irreversible damaging and, thus, may entail a replacement of the affected reflective optical elements.

Thus far, one has attempted to counter a negative alteration of the surface by providing a cover layer system on the surface of the reflective optical element, supposed to protect the surfaces. The basic layout of traditional reflective optical elements is sketched in FIGS. 1a to c. These show three different multilayer systems 2. In FIG. 1a, a multilayer system 2 is shown in which the layer thicknesses are constant both along the thickness of the multilayer system 2 and also across the surface. FIG. 1b shows a multilayer system 2 in which the thickness relations of a period are constant along the entire depth, but there is a nonconstant distribution of thicknesses in the surface, and so the multilayer system 2 has a lateral gradient. In FIG. 1c, the multilayer system 2 does not have a lateral gradient, but the distribution of layer thicknesses varies across the depth of the multilayer system (so-called depth-graded multilayer). All multilayers are deposited on a substrate 3. Beneath the multilayer system 2, a portion of the substrate 3 is configured as an optically shaping region 5, also known as a shaper. The shaper 5 is needed primarily to give the optical element 1 a shape which leads to the desired optical properties. The multilayer system 2 borders on a cover layer system 6, which in FIGS. 1a to c consists of two segments 7, 8, one segment 7 generally serving to adapt the phase to the multilayer system or to the interdiffusion protection and the second segment 8 generally serving for the actual contamination protection. The boundary surface 4 of the cover layer system 6 next to the vacuum is known as the free boundary surface 4.

Thus far in the prior art it has been attempted to positively influence the contamination and degradation of the reflective optical element by the choice of specific cover layer materials. Thus, for example, U.S. Pat. No. 6,228,512 proposes having a protective layer of $SiO_2$, $Zr_2O$ or $ZnO$ on a MoRu/Be multilayer, which does not react with water. In particular, ZnO is recommended, for when zinc is applied there is formed a ZnO layer only 0.5 to 0.6 nm thick, which sufficiently protects the multilayer against oxidation, without significantly impairing the reflectivity—because of its slight thickness.

U.S. Pat. No. 5,958,605 proposes a special protection layer system for EUV multilayers in which a lower layer of silicon or beryllium is proposed, placed directly on the multilayer, and at least one top layer is applied onto the lower layer, and this top layer has a material which is resistant to oxidation and corrosion and also protects the underlying layers against oxidation.

While the protective layers of U.S. Pat. No. 5,958,605 and U.S. Pat. No. 6,228,512 provide a protection against degradation by the influence of oxygen, there still occurs a contamination from carbon-containing substances. These lead to uncontrolled losses of reflectivity and changes in the wave front.

SUMMARY OF THE INVENTION

Against this background, the problem of the invention is to provide a reflective optical element or a corresponding optical system or an EUV lithography appliance in which the negative influence of contamination and degradation is as low as possible.

This problem is solved by a reflective optical element, an optical system, and an EUV lithography machine according to the claims. Furthermore, this problem is solved by a semiconductor element according to the claims.

The present invention is based on the principle of using not merely the selection of materials, but also the geometry of the cover layer system to render the general degradation and especially the contamination by carbon-containing substances as low as possible, or to make their influence manageable. By specific choice of the thickness distribution d(x, y) of the cover layer system as a function of its spatial coordinates, wherein at least one layer of the cover layer system should have a gradient not equal to zero, one can control how much contamination occurs at which places of the surface. In this way, the contamination can be calculated and factored in when operating or designing of reflective optical elements, optical systems, and EUV lithography appliances.

If the reflective optical element has a multilayer system, the gradient of the two-dimensional thickness distribution of the cover layer system that is different from zero in at least one direction is not equal to the gradient of the two-dimensional thickness distribution of the multilayer system.

The reflective optical element coated with a multilayer system for the extreme ultraviolet and/or soft x-ray region with a cover layer system containing at least one layer whose spatial position can be described in a Cartesian system of coordinates (x, y, z) by z=z(x, y) can be characterized in that the gradient of the thickness distribution d(x, y) of at least one layer of the cover layer system at location (x, y) is not equal to the gradient of the at most ten individual layers of the multilayer system immediately adjacent to the cover layer system.

Preferably, at least one layer of the cover layer system (6) has thickness variations ≥1 Å, preferably ≥3 Å, especially ≥5 Å, over the surface of the optical element.

If the reflective optical element has a shaper, it can be advantageous for the thickness distribution of the cover layer system to be such that the free boundary surface of the reflective optical element reproduces the shape of the shaper in at least one direction relative to the xy-coordinates. The thickness variations of the cover layer system can just compensate for the lateral gradient of the multilayer system. This facilitates interferometric checking of the reflective optical element. Furthermore, one can thereby specifically shift the phase of the standing wave produced upon reflection.

In an especially preferred embodiment, the thickness distribution varies monotonically, preferably strictly monotonically, in at least one direction relative to the xy-coordinates with the intensity distribution across the beam cross section of the operating incident radiation. This adapts the thickness distribution of the cover layer system to the electrical field intensity at the location of the free boundary surface of the standing wave produced by reflection, so as to specifically modify the number of photo-induced electrons.

Increasingly more photoelectrons are produced in places with high radiation intensity and they split the residual gas components adsorbed on the surface into reactive products, which results in increased contamination or degradation of the surface. Assuming that the free boundary surface is positioned relative to the standing wave so that the electrical field intensity decreases with larger cover layer thickness, an especially large thickness of the cover layer system will now be provided in regions with high radiation intensity. This will locally modify the electrical field intensity of the standing wave produced by reflection at the location of the free boundary surface next to the vacuum so that fewer photoelectrons are induced. Thus, for example, one can adjust a rate of photoemission which is constant over the entire surface, regardless of the radiation intensity. This will diminish or entirely prevent imaging errors due to contamination, especially during permanent duty in lithography machines.

In another preferred embodiment, the thickness distribution of the cover layer system is such that the convolution in regard to the xy-coordinates of the intensity distribution across the beam cross section of the operating incident radiation with the electrical field intensity of the standing wave formed by reflection at the free boundary surface, normalized to the incident radiation intensity, yields a linear distribution, a rotationally symmetrical distribution, or a superpositioning of a linear and a rotationally symmetrical distribution (hereafter known as degradation profile).

Instead of the convolution, one can also undertake a weighted multiplication P=P(x, y) with respect to the xy-coordinates of the intensity distribution across the radiation cross section I(x, y) by the electrical field intensity E(x, y) formed at the free boundary surface and normalized to the radiation intensity, i.e., P(x, y)=A(x, y)×I ((x, y)×E(x, y), where A(x, y) is a dimensionless factor, dependent on the cover layer material, preferably lying in the range of 1 to 4.

P(x, y) is "linear" precisely (disregarding the physical dimensional units) when: "P(x=const., y) can be represented as P(x=const., y)=y+b and P(x, y=const.) can be represented as P(x, y=const.)=cy+d [with a, b, c, d∈R]."

P(x, y) is "rotationally symmetrical" precisely (disregarding the physical dimensional units) when: "There is no point $(x_0, y_0)$ such that for all (x, y) on the mirror surface we have:

$$P(\sqrt{(x-x_0)^2+(y-y_0)^2})=\text{const."}$$

P (x, y) is "a superpositioning of a linear and a rotationally symmetrical function" precisely (disregarding the physical dimensional units) when: "P(x, y) can be represented as a linear combination of a linear and a rotationally symmetrical function per the above definitions."

The "normalized electrical field intensity at the free boundary surface" denotes the gain factor of the actual electrical field intensity at the free boundary surface (based on the resulting standing wave) as compared to the time-averaged intensity of the free traveling wave. The magnitude of the normalized electrical field intensity at the free boundary surface is in the range of 0 to approximately 4 and is calculated for each individual point (x, y) of the surface from the relative position of free boundary surface and standing wave field.

The degradation profile corresponds to the two-dimensional photoemission profile across the irradiated surface of an optical element with a cover layer system. Both the intensity distribution of the operating incident radiation and the normalized electrical field intensity of the standing wave formed by reflection at the locus of the free boundary surface can be calculated on the basis of a first thickness distribution of the cover layer system for defined cover layer materials and defined operating wavelengths. By varying both the intensity distribution of the operating incident radiation and the normalized electrical field intensity of the standing wave until the convolution of both quantities agrees with the desired outcome, the ultimate thickness distribution of the cover layer system can be found by calculating backward. In the most simple case of degradation, which is carbon contamination, the convolution is a point by point multiplication. In the general case of degradation, this convolution is an integration over space and time of the above product, multiplied by a function dependent on the degradation process.

The special advantage is that linear and rotationally symmetrical gradients can be compensated by actuators on which the optical elements can be mounted if necessary. The compensation for geometrical errors of optical elements by means of actuators has long been widely used. Imaging errors can be avoided by modifying the rate of photoemission with different thicknesses of the cover layer system and compensating for the remaining gradients with actuators.

Especially preferred is a degradation profile such that its value diminishes at each point of the surface with increasing thickness of the cover layer system, i.e., at each point (x, y) of the surface of the reflective optical element where the free boundary surface emerges on account of contamination, the intensity of the photoemission decreases, with the emergence of the free boundary surface corresponding to an increase in the layer thickness. Otherwise, one would have the effect of a further increase in the likelihood of increased contamination when the thickness is increased by contamination. This has to do with the phase position of the standing wave relative to the free boundary surface, which must always be chosen such that the intensity of the standing wave decreases at the location of the free boundary surface when the thickness of the cover layer increases, in order to prevent excessive contamination. In the case of degradation due to ablation of the layer, the phase location needs to be adjusted in the opposite way.

The optical system with at least two reflective optical elements for the extreme ultraviolet and/or soft x-ray wavelength range with a cover layer system for each is characterized in that the cover layer systems have different materials and/or different thickness distributions in the z-direction as a function of the x and/or y coordinate, and the thickness distribution of at least one layer of a cover layer system has a gradient not equal to zero.

According to a particular embodiment, the cover layer systems have different materials and/or have different thickness distributions in the z-direction as a function of the x and/or y coordinates, and the gradient of the thickness distribution d(x, y) of at least one layer of the cover layer system at the location (x, y) is unequal to all gradients of the maximum of 10 immediately adjacent single layers of the multilayer system belonging to the cover layer system.

In the case of optical systems with two or more reflective optical elements or corresponding EUV lithography appliances, one can use cover layer systems with thickness gradients and/or different cover layer materials so that the necessary two-dimensional profile of photoelectron emission and thus the required degradation profile can be specifically adjusted for each optical element. In particular, a differentiation in terms of incident radiation intensity and wavelength band is advisable.

Mirrors at the start of the wave path are subject to a high radiation intensity and exhibit a broad wavelength band. One should optimize these reflective optical elements, under a certain loss of reflectivity, so that the photocurrent is as low as possible and constant across the surface, in order to prolong their lifetime.

Reflective optical elements at the end of the wave path, which are used for the actual imaging, are narrow-band and only subject to a slight radiation intensity. These should be optimized for a high reflectivity. For because of the overall lower intensities, the emission of photoelectrons should have less effect and result in relatively less contamination.

A special advantage is that one can adjust an approximately identical lifetime for individual groups of reflective optical elements of an optical system or an EUV lithography appliance.

Semiconductor components produced with the help of the invented reflective optical elements or optical systems or EUV lithography appliances have the advantage of being produced with lower reject rates and lower cost. On the one hand, the imaging quality is better since the degradation is manageable, and on the other hand longer lifetimes can be achieved for the devices.

BRIEF DESCRIPTION OF THE DRAWINGS

The invention shall now be explained more closely by means of the following examples. These show:

FIG. 1a-c, reflective optical element of the prior art;

FIG. 2a, the two-dimensional intensity distribution of incident EUV radiation for a first optical element;

FIG. 2b, the thickness distribution or the EUV radiation intensity distribution on the cover layer system of a first optical element from FIG. 2a in the y-direction;

FIG. 2c, the thickness distribution or the EUV radiation intensity distribution on the cover layer system of a first reflective optical element from FIG. 2a in the y-direction;

FIG. 5a, the two-dimensional intensity distribution of incident EUV radiation for a second optical element;

FIG. 5b, the thickness distribution and the EUV radiation intensity distribution on the cover layer system of a first reflective optical element from FIG. 5a in the y-direction;

FIG. 5c, the thickness distribution or the EUV radiation intensity distribution on the cover layer system of a first reflective optical element from FIG. 5a in the x-direction;

FIG. 8a, the two-dimensional intensity distribution of incident EUV radiation for a third optical element;

FIG. 8b, the thickness distribution and the EUV radiation intensity distribution on the cover layer system of a first reflective optical element from FIG. 8a in the y-direction;

FIG. 8c, the thickness distribution or the EUV radiation intensity distribution on the cover layer system of a first reflective optical element from FIG. 8a in the x-direction;

DETAILED DESCRIPTION OF THE INVENTION

Figure 1A:
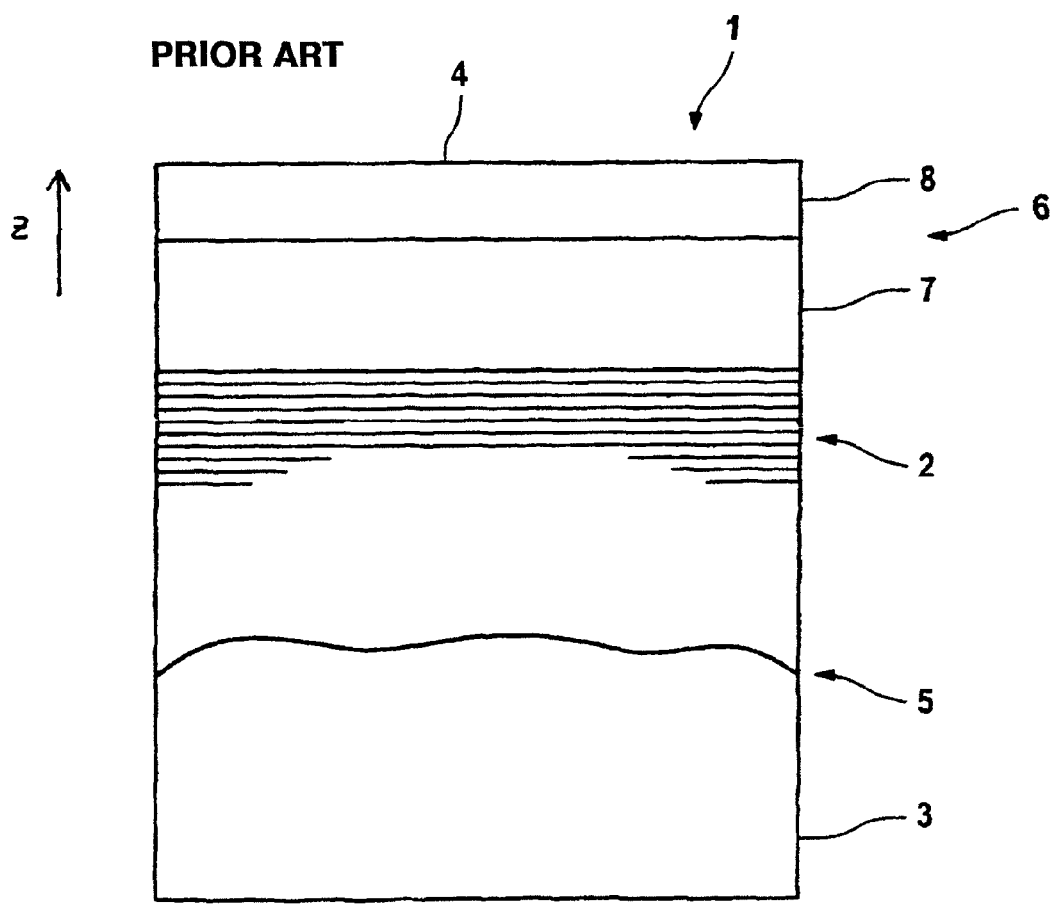

FIGS. 1a to c have already been explained.

Figure 3A:
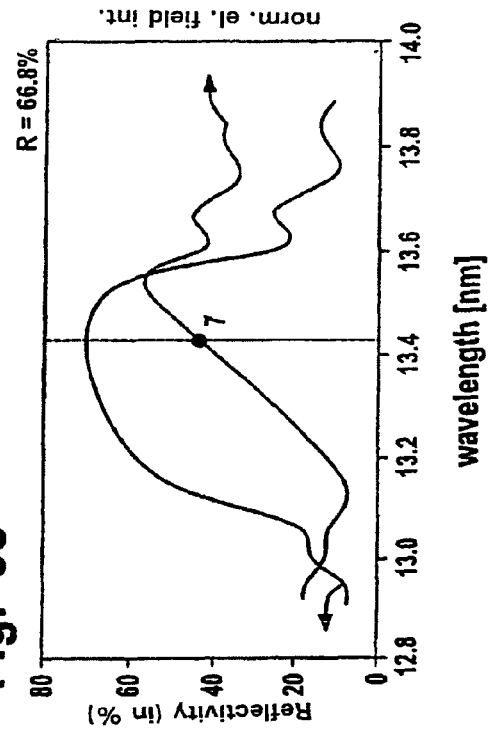
FIGS. 3a, c, e, g, the reflectivity or the normalized electrical field intensity at the location of the free boundary surface of the standing wave formed by reflection at a fixed angle of incidence as a function of the wavelength for different positions of the free boundary surface on the first reflective optical element.
Figure 3C:
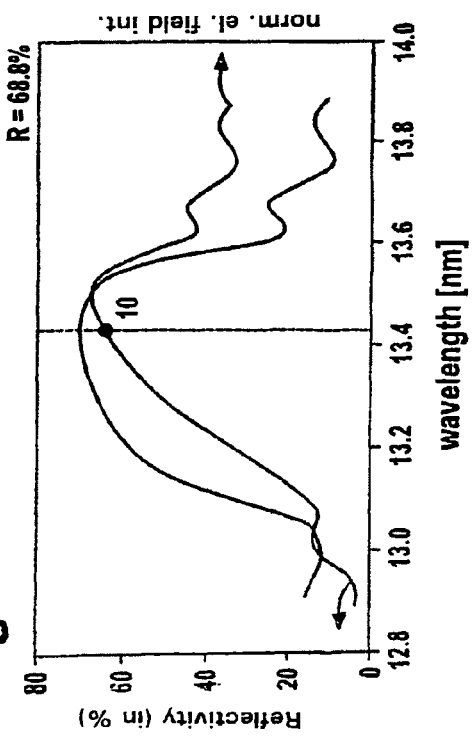
FIGS. 3b, d, f, h, the normalized electrical field intensity of a standing wave formed by reflection at a fixed angle of incidence and strongly influencing the photocurrent on the first reflective optical element as a function of the cover layer system depth for different positions of the free boundary surface on the first reflective optical element.

In FIGS. 2 to 4, a first preferred embodiment of the invented optical element is described.

FIG. 2a shows the two-dimensional intensity distribution of incident EUV radiation for a first optical element with which the reflective optical element is to be utilized. The intensity increases from the outside to the middle.

FIGS. 2b and 2c show the intensity curve in the x and y direction corresponding to the broken lines drawn in FIG. 2a. This intensity curve in the xy-direction corresponds in monotonic manner to the thickness curve of the cover layer system. Where a high radiation intensity impinges on the reflective optical element, the cover layer system is also particularly thick. Where the intensity is less, the cover layer system is also thinner. Corresponding to FIGS. 1a-c, the thickness distribution designated as 7 pertains to the lower segment of the cover layer system and the thickness distribution designated as 8 corresponds to the upper segment of the cover layer system.

Figure 3B:
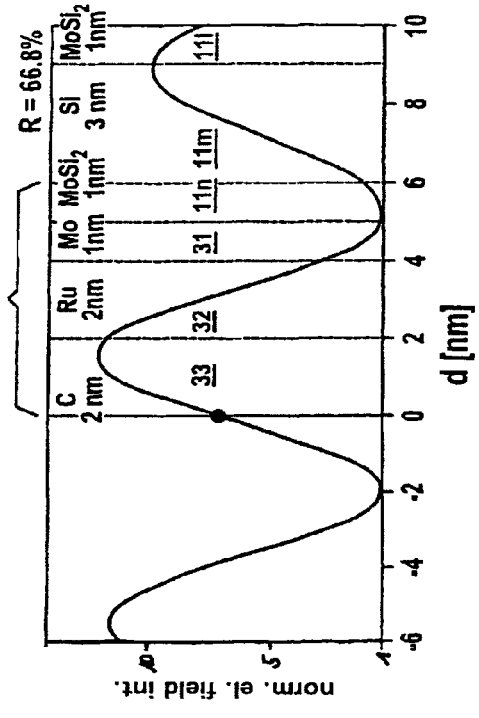
Figure 3D:
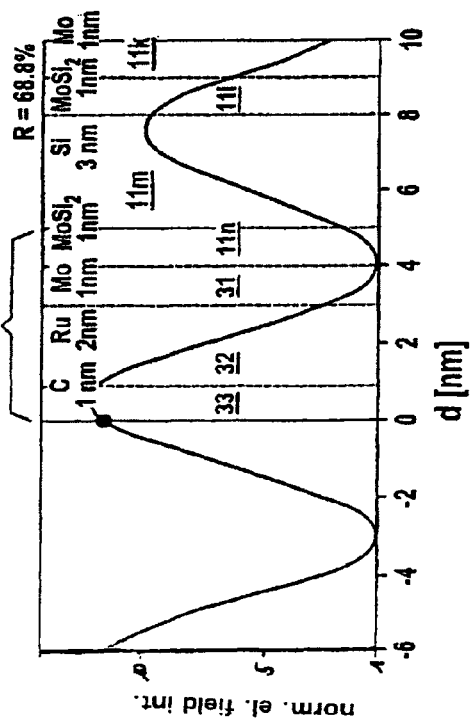
Figure 3E:
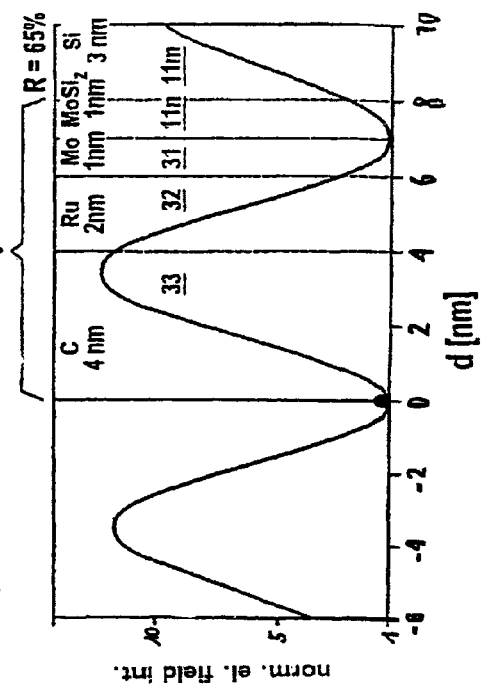
Figure 3F:
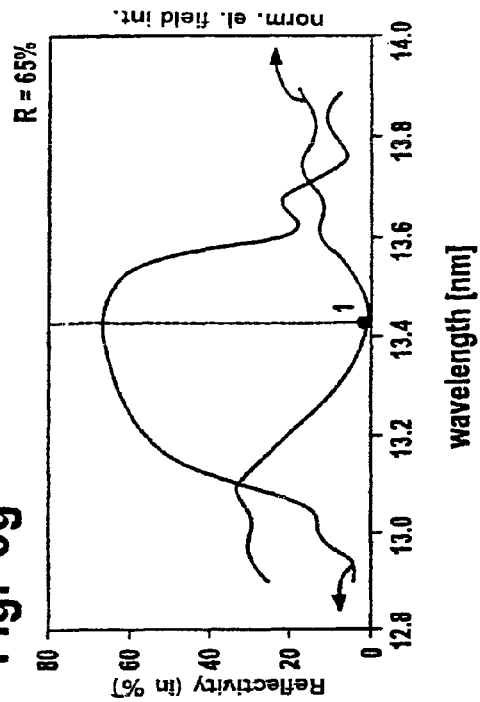
Figure 3G:
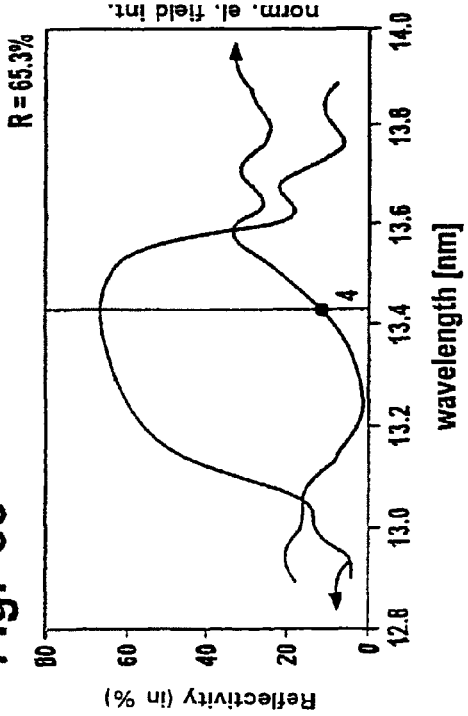
Figure 3H:
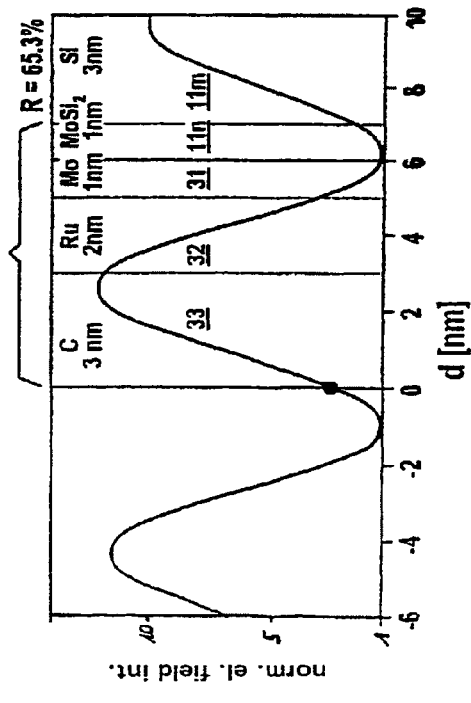
Figure 4A:
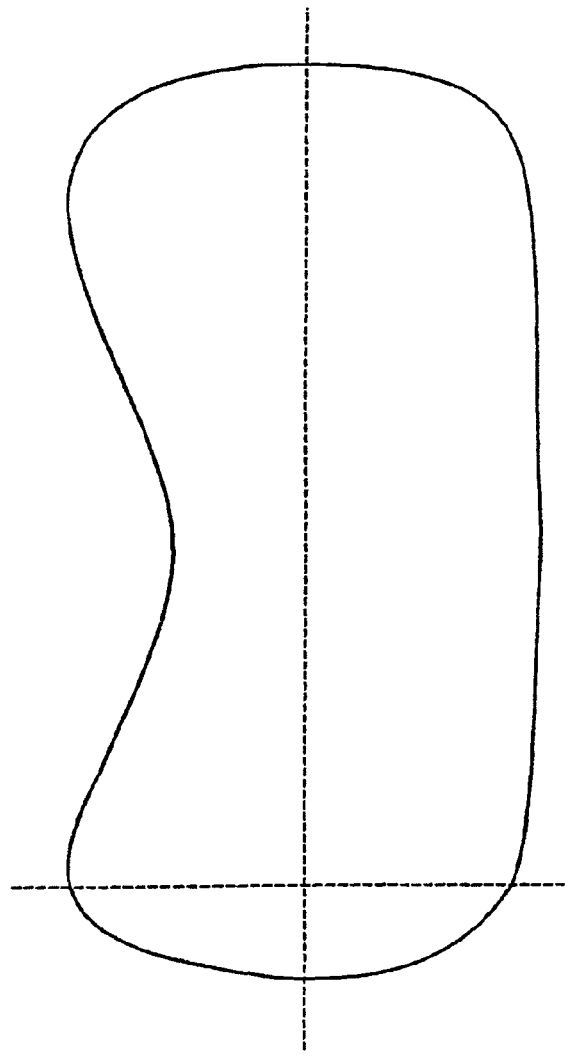
FIG. 4a, the resulting two-dimensional photoemission profile on the first reflective optical element.
Figure 4C:
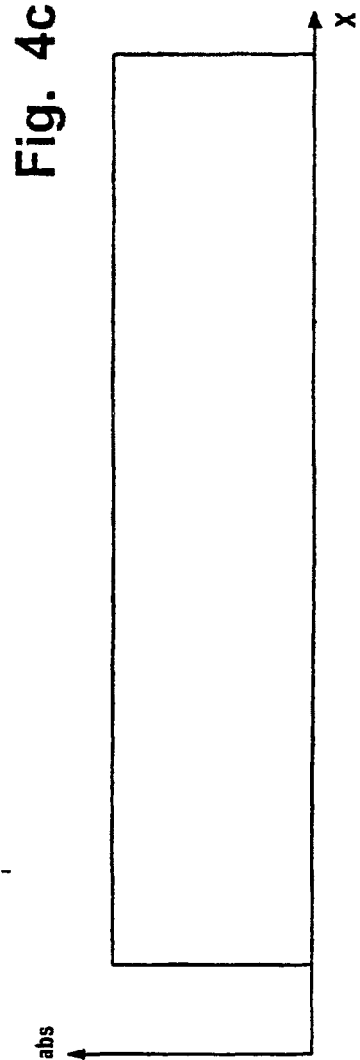
FIG. 4c, the photoemission profile from FIG. 4a in the x-direction.
Figure 4B:
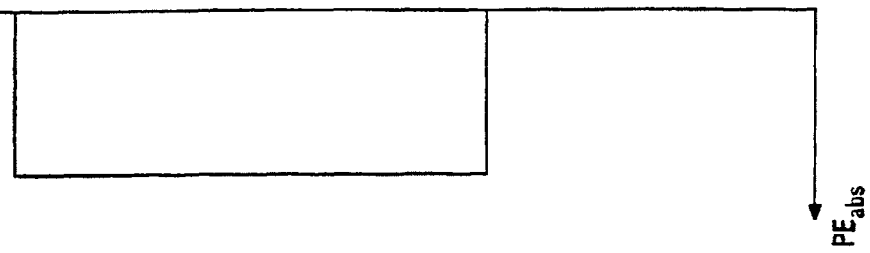
FIG. 4b, the photoemission profile from FIG. 4a in the y-direction.

As can be seen in FIGS. 3b, d, f, h, the specific reflective optical element is a silicon-molybdenum multilayer with $MoSi_2$ intermediate layers and a cover layer system 6 consisting of a lower segment 7 of $MoSi_2$, molybdenum, and ruthenium.

The carbon layer corresponds to the upper segment 8 of the cover layer system.

FIGS. 3a, c, e, g plot the reflection curve as a function of the wavelength of incoming radiation, as well as the normalized electrical field intensity of the standing wave formed by reflection at the site of the free boundary surface. Broken lines show the position of the operating wavelength. In arbitrary units, the normalized electrical field intensity at the site of the free boundary surface is 10 units in FIG. 3a, 7 units in FIG. 3c, 4 units in FIGS. 3e and 1 unit in FIG. 3g. In FIGS. 3b, d, f, h, the normalized electrical field intensities are plotted at the operating wavelength as a function of the position of the standing wave relative to the individual layers and to the free boundary surface at the vacuum. FIGS. 3a and b, FIGS. 3c and d, FIGS. 3e and f, and FIGS. 3g and h go together.

As regards the intensity distribution of incident radiation and the thickness distribution of the reflective optical element, the indicated points lie on the line designated in FIG. 2a. FIGS. 3a, b are located at the edge of the distribution, where the cover layer thickness is 5 nm. In the case of FIGS. 3c, d, the cover layer thickness is 6 nm, for FIGS. 3e, f it is 7 nm and for FIGS. 3g, h it is 8 nm. Here, both the radiation intensity and the layer thickness are the highest.

The resulting photoemission profile can be estimated by multiplying the normalized field intensity value of the standing wave at the location of the free boundary surface by the value of the radiation intensity at this place. In FIGS. 3a, b, the intensity of the EUV radiation is 1 unit, in FIGS. 3c, d it is 1.5 units, in FIGS. 3e, f it is 2.5 units and in FIGS. 3g, h it is 10 units. Thus, one gets a constant photoemission profile of 10 units over the entire surface. This profile is depicted in two dimensions in FIG. 4a and along the broken line in the y-direction in FIG. 4b and in the x-direction in FIG. 4c.

The constant photoemission profile over the entire surface is achieved thanks to a decrease in the relative reflectivity toward the middle. The reflectivity decreases from 68.8% at the margin to 65% at the intensity maximum, which should be properly factored into the optical design of the overall system. A reflectivity loss varying in time due to the buildup of a thick and inhomogeneous contamination would be much less favorable to the illumination of the wafer and the wave front properties.

Moreover, one must properly select the phase location of the standing wave relative to the free boundary surface of the reflective optical element. Contrary to the example above (FIGS. 3b, d, f, h), a phase shift by half a period with increasing thickness of the protective layer would also increase the normalized electric field intensity of the standing wave at the site of the free boundary surface and thus the contamination would further build up over time.

In FIGS. 5 to 7, a second sample embodiment of the reflective optical element is explained. Here, there is a homogeneous intensity distribution 9 of the incident radiation (FIG. 5a). The reflective optical element, however, has a lateral gradient in the multilayer system. On top of this, as shown by FIGS. 5b, c, there is placed a cover layer system with a thickness distribution. The multilayer system with lateral gradient is placed on a substrate which has a flat shaper. The coating with the cover layer system shown in FIGS. 5b, c has the effect that the free boundary surface reproduces the shaper. Thus, the thickness variation of the multilayer system is exactly compensated by the thickness variation of the cover layers.

Figure 6A:
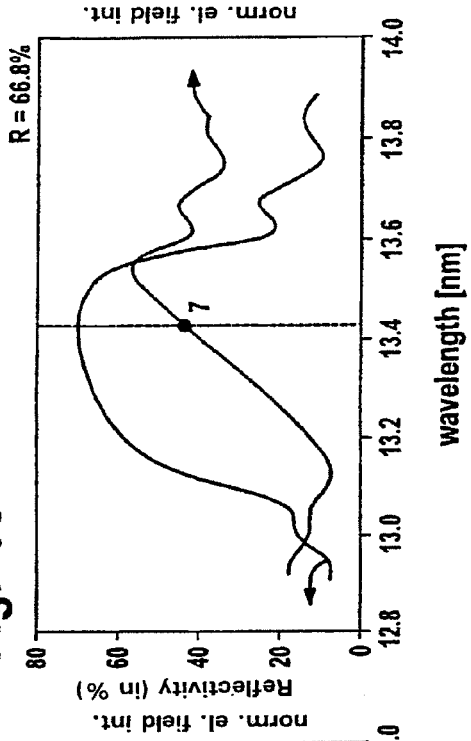
FIGS. 6a, c, e, g, the reflectivity or the normalized electrical field intensity at the location of the free boundary surface of the standing wave formed by reflection at a fixed angle of incidence as a function of the wavelength for different positions of the free boundary surface on the second reflective optical element.
Figure 6B:
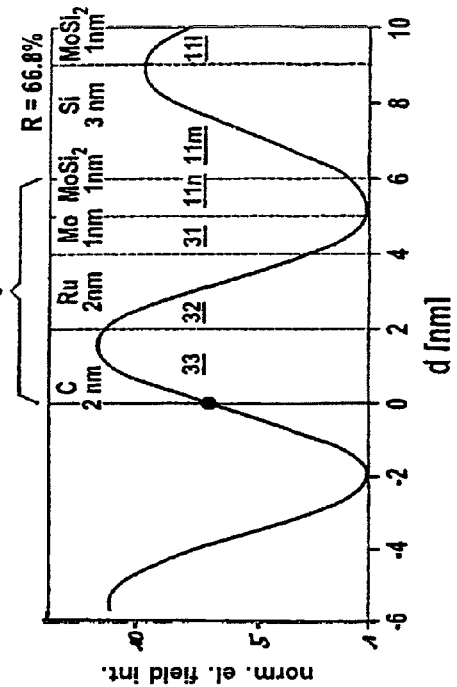
FIGS. 6b, d, f, h, the normalized electrical field intensity of a standing wave formed by reflection at a fixed angle of incidence and strongly influencing the photocurrent on the first reflective optical element as a function of the cover layer system depth for different positions of the free boundary surface on the second reflective optical element.
Figure 6C:
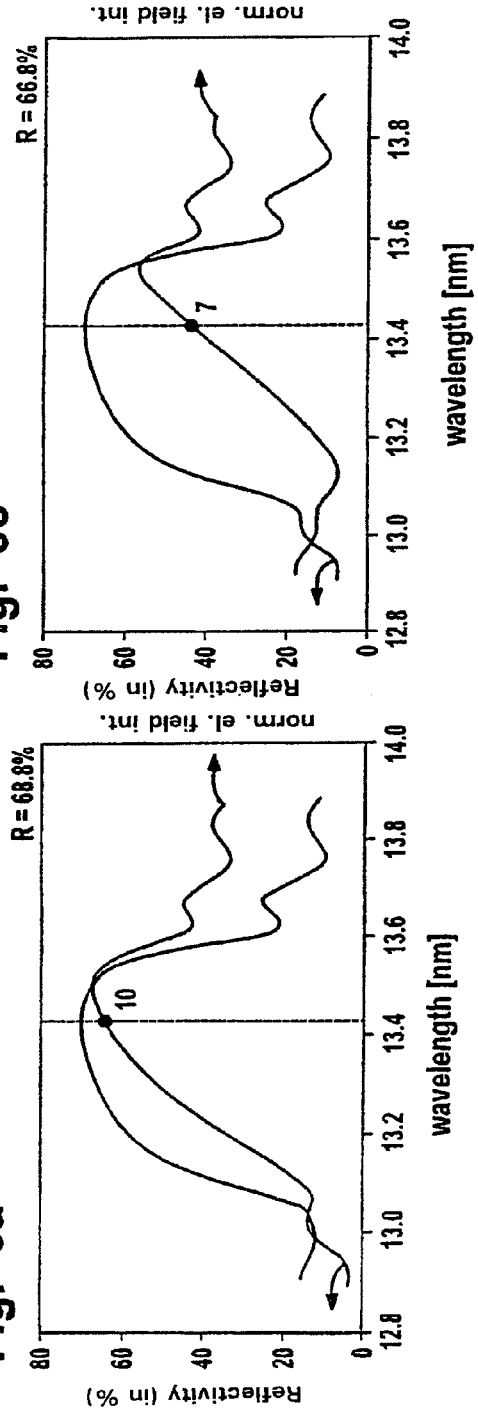
Figure 6D:
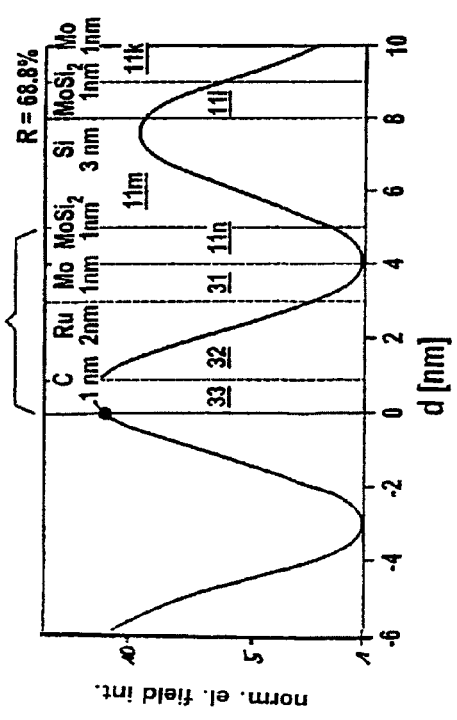
Figure 6E:
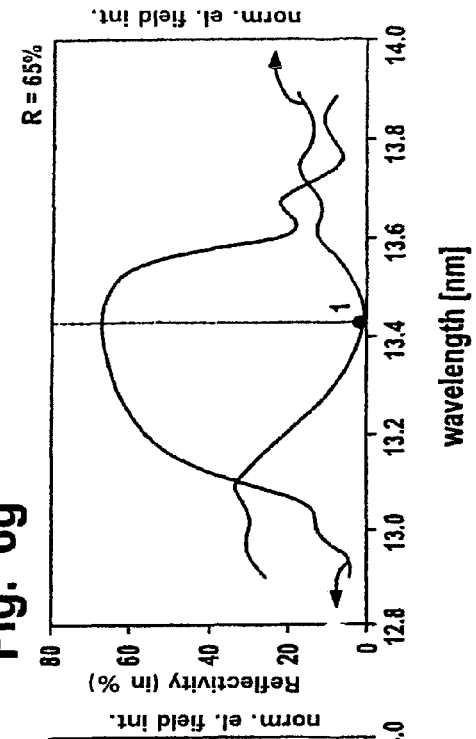
Figure 6F:
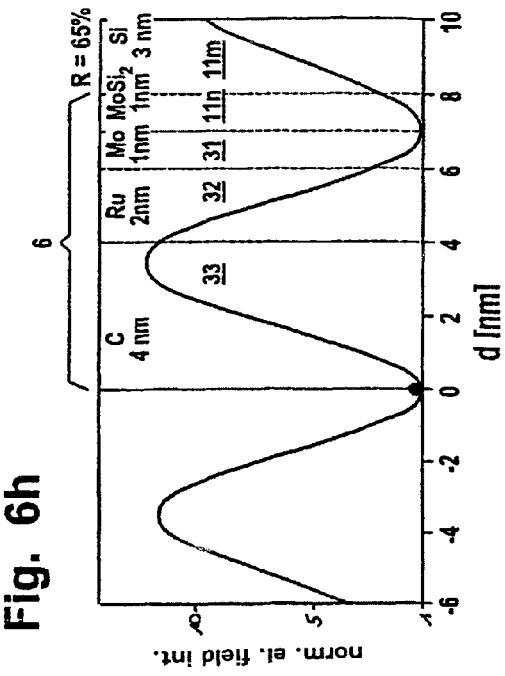
Figure 6G:
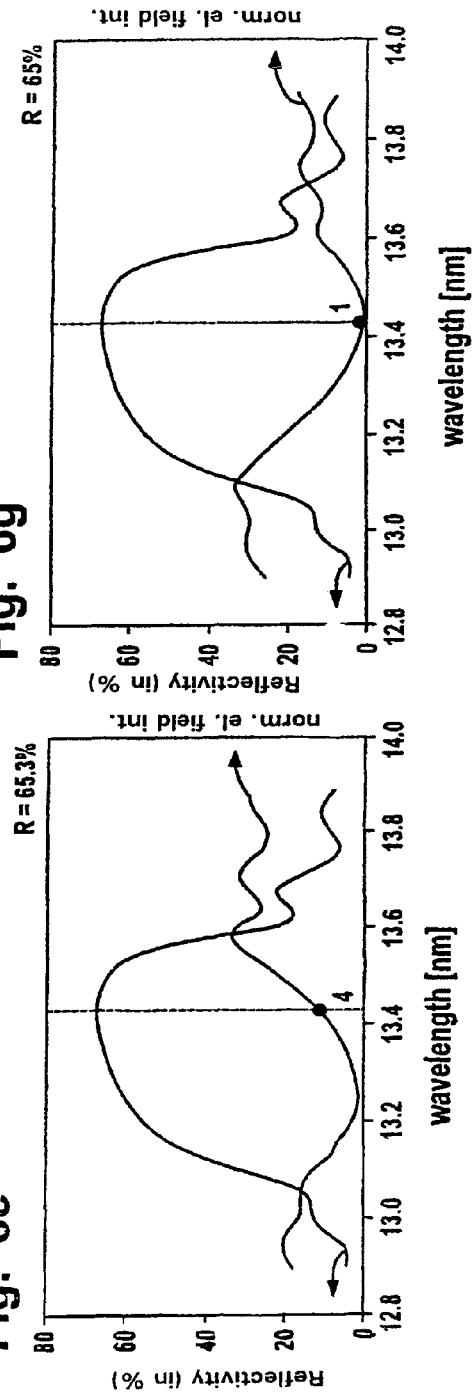
Figure 6H:
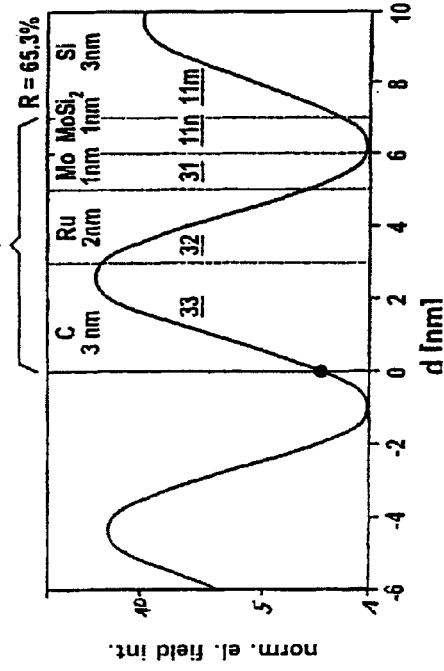

The situation regarding the positions 1, 2, 3, 4 of FIG. 5a is represented in FIGS. 6a, b, 6c, d, 6e, f and 6g, h. The intensity of the radiation is 1 unit throughout, the normalized electrical field intensity value of the standing wave is 10 units in FIG. 6a, 7 units in FIG. 6c, 4 units in FIG. 6e and 1 unit in FIG. 6g.

Figure 7A:
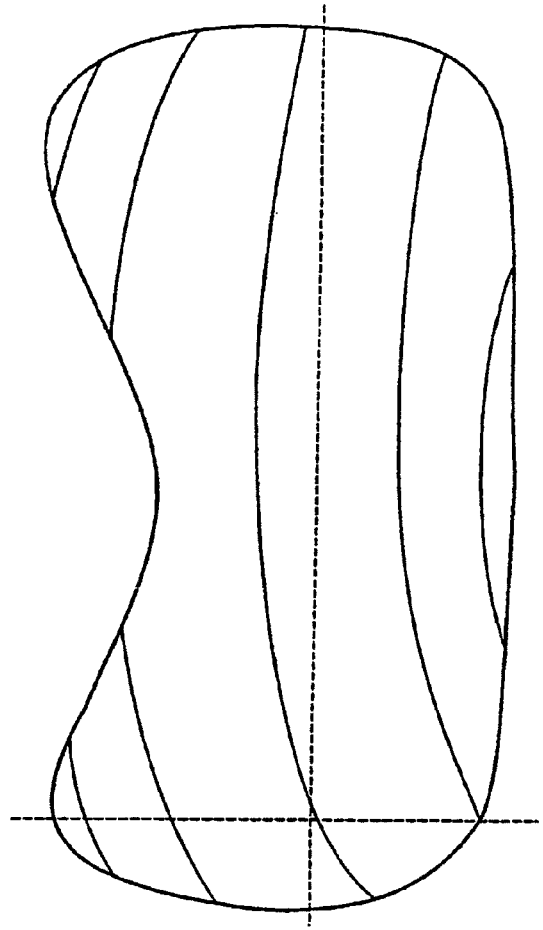
FIG. 7a, the resulting two-dimensional photoemission profile on the second reflective optical element.
Figure 7B:
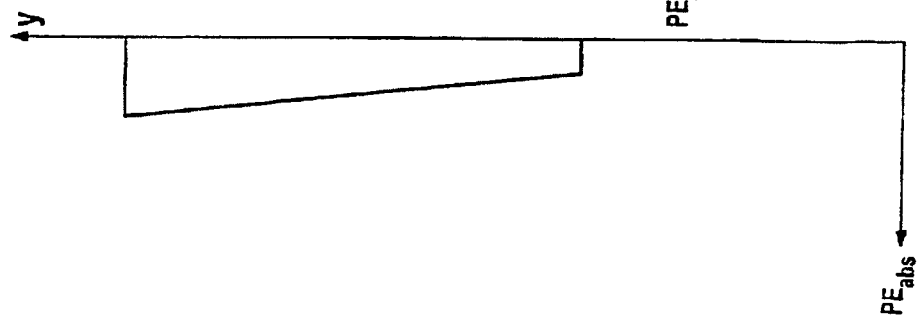
FIG. 7b, the photoemission profile from FIG. 7a in the y-direction.
Figure 7C:
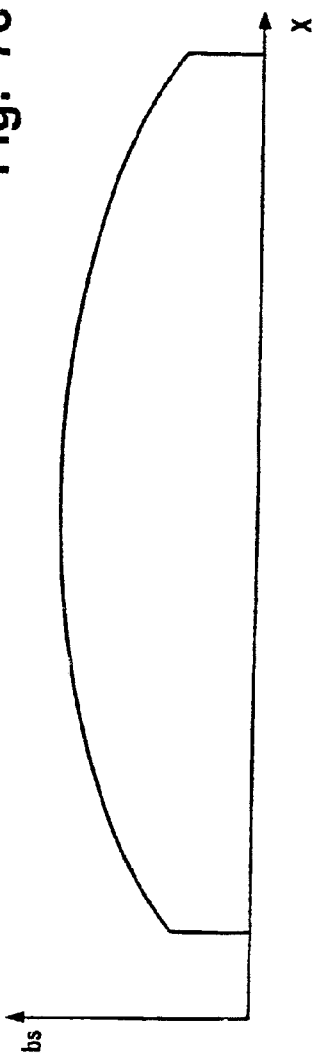
FIG. 7c, the photoemission profile from FIG. 7a in the x-direction.
Figure 9A:
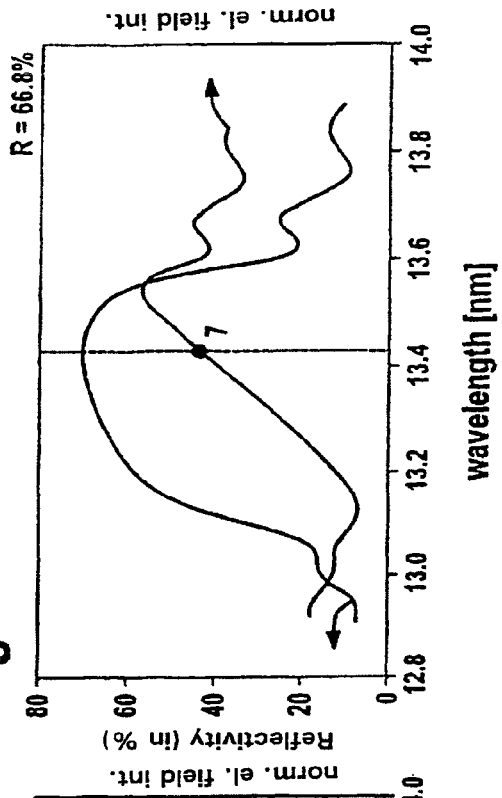
FIGS. 9a, c, e, g, the reflectivity or the normalized electrical field intensity at the location of the free boundary surface of the standing wave formed by reflection at a fixed angle of incidence as a function of the wavelength for different positions of the free boundary surface on the third reflective optical element.
Figure 9C:
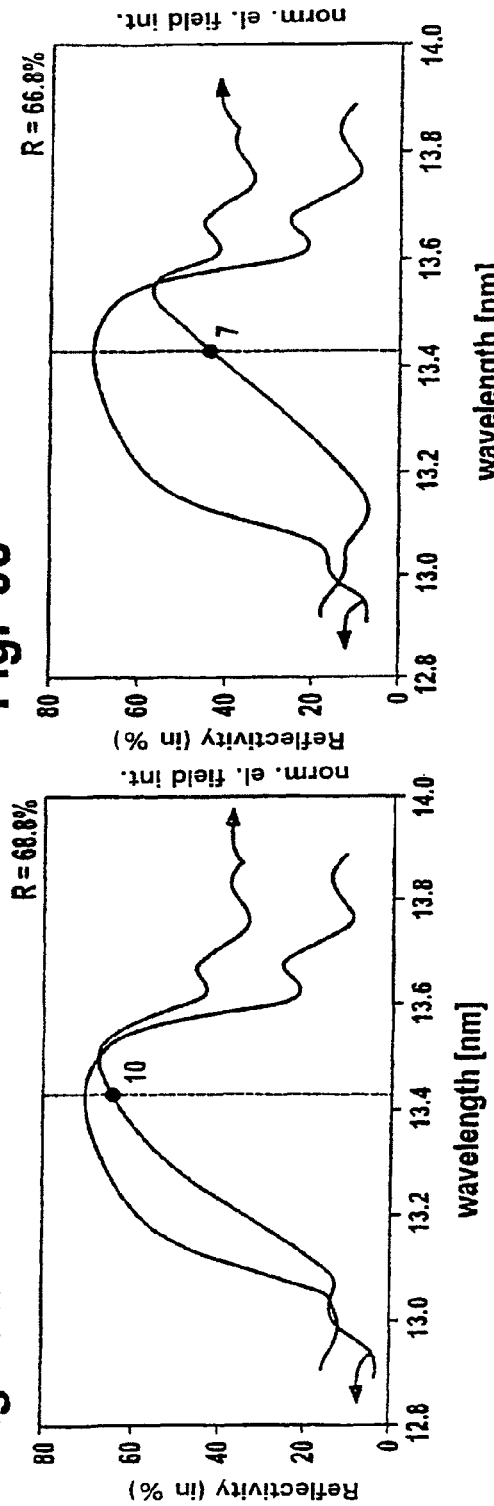
FIGS. 9b, d, f, h, the normalized electrical field intensity of a standing wave formed by reflection at a fixed angle of incidence and strongly influencing the photocurrent on the first reflective optical element as a function of the cover layer system depth for different positions of the free boundary surface on the third reflective optical element.
Figure 9B:
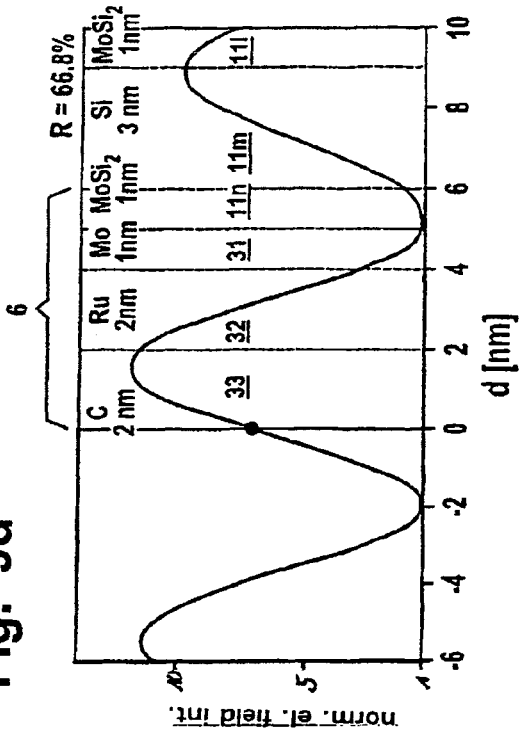
Figure 9D:
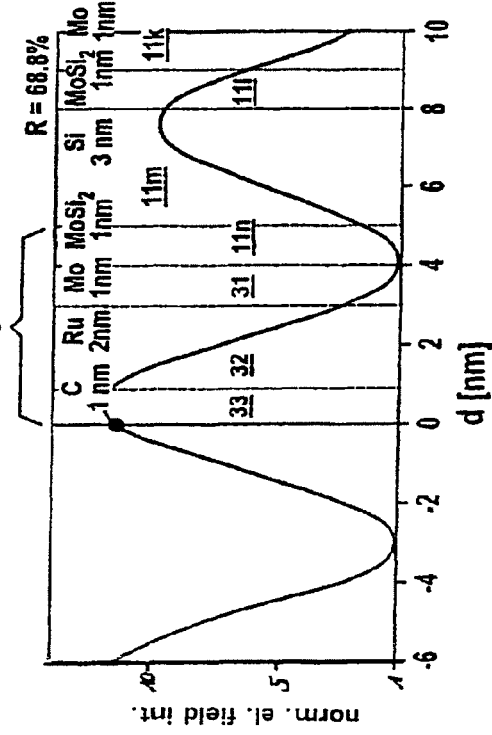
Figure 9E:
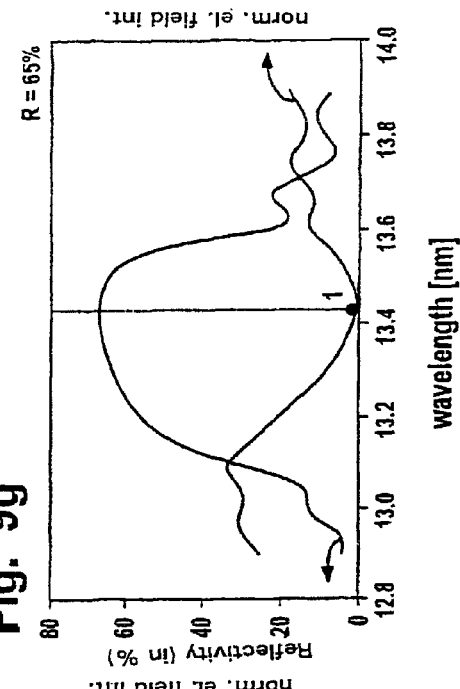
Figure 9F:
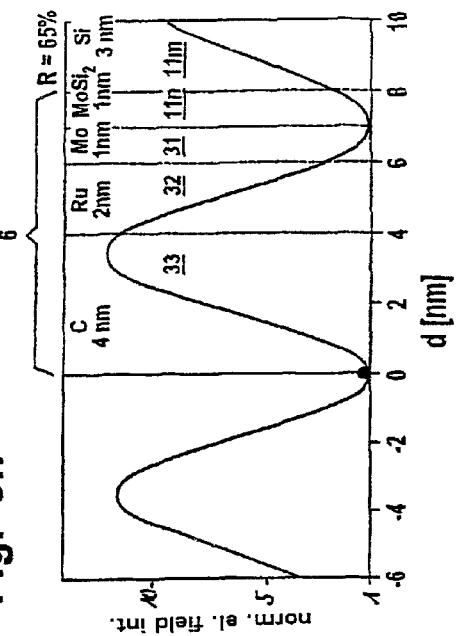
Figure 9G:
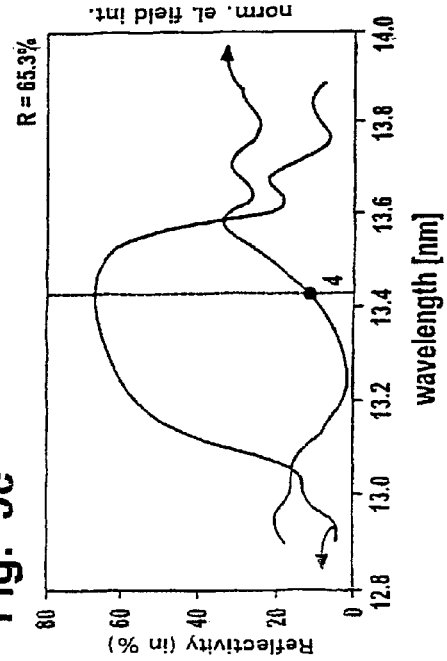
Figure 9H:
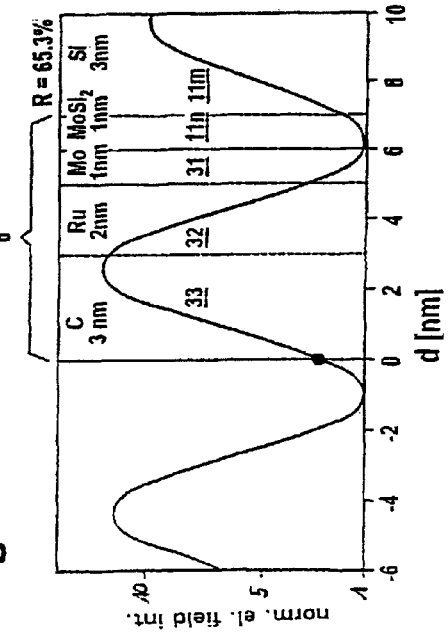

The resulting photoemission profile is depicted in FIGS. 7a to c and has a value of 10 units at position 1, 7 units at position 2, 4 units at position 3, and 1 unit at position 4. Even though the contamination profile is no longer constant for this special optical element, it can still be calculated and therefore factored into the configuration of optical systems. Furthermore, this reflective optical element is especially suitable for optical interferometric inspection of its construction. Moreover, it can be specifically used as a phase shifter in an optical system.

Figure 10A:
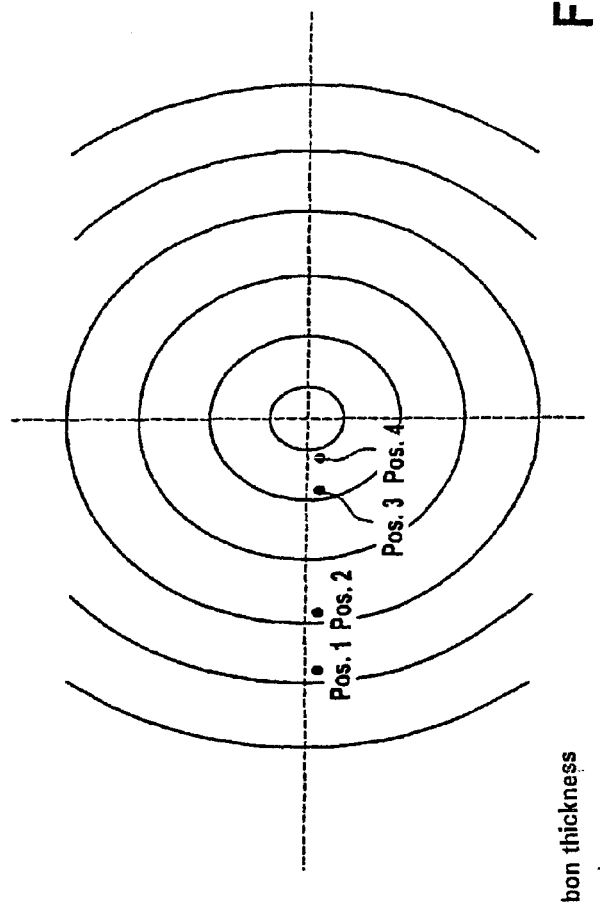
FIG. 10a, the resulting two-dimensional photoemission profile on the third reflective optical element.
Figure 10C:
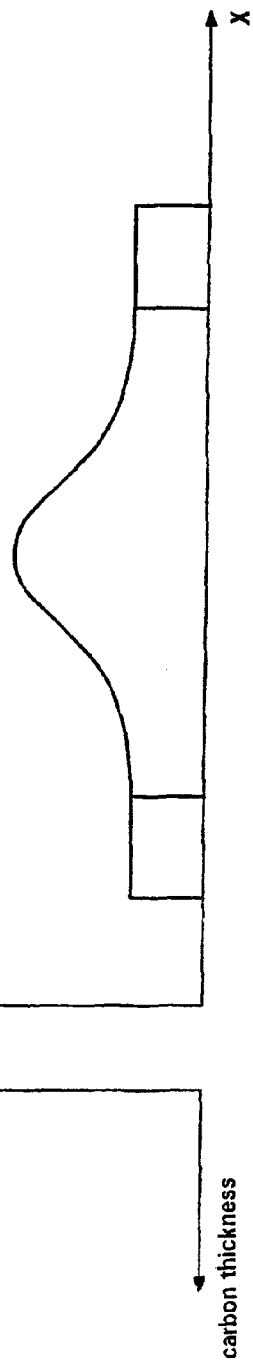
FIG. 10c, the photoemission profile from FIG. 10a in the x-direction.
Figure 10B:
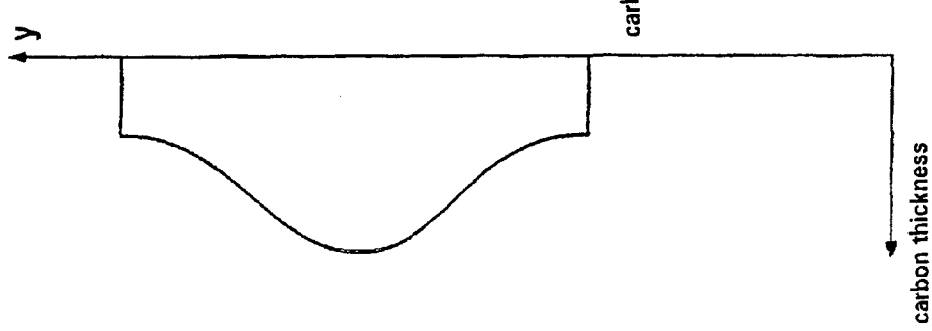
FIG. 10b, the photoemission profile from FIG. 10a in the y-direction.

In FIGS. 8 to 10, a third embodiment of the reflective optical element is presented. This reflective optical element is to be used with a radiation whose intensity distribution is neither linear nor rotationally symmetrical, but rather elliptical, for example. Since a constant thickness of cover layer is preserved in the y-direction (FIG. 8b, broken line) and the layer thickness distribution varies monotonically with the intensity distribution in the x-direction (FIG. 8c, broken line), the end result is a rotationally symmetrical carbon contamination profile (FIGS. 10a to c).

In FIGS. 9a to h, the situation is shown at positions 1 to 4 in FIG. 8a. At a layer thickness of 5 nm (FIGS. 9a, b), the standing wave has a normalized electrical field intensity of 10 units and the intensity is likewise 10 units. This gives a value of 100 units for the photoemission. At a layer thickness of 6 nm, the normalized electrical field intensity of the standing wave is 7 units and the intensity is 7 units. This gives a value of 49 units for the photoemission. At a layer thickness of 7 nm, the normalized electrical field intensity of the standing wave is 4 units and the intensity is likewise 4 units. This gives a photoemission of 16 units. At a thickness of 8 nm, the normalized electrical field intensity of the standing wave is 1 unit, the value of the intensity is 1 unit, and the overall value for the photoemission is likewise 1 unit. Thus, thanks to the special thickness distribution of the cover layer system, the contamination profile is flattened in the y-direction, while it is preserved in the x-direction, so that the profile can be converted from an elliptical shape to a rotationally symmetrical shape, as shown in FIG. 10a-c. The rotationally symmetrical profile can be compensated by means of actuators through a movement of the reflective optical element in the direction of the surface normals, so that there are no effects on the imaging properties.

A similar technique is possible with suitable adjustment of the thickness distribution of the cover layer system in order to achieve linear gradients.

Furthermore, it is conceivable by suitable adjustment of the thickness distribution of the cover layer system to achieve a cleaning action which leaves behind liner or rotationally symmetrical (and thus correctable by actuator) degradation everywhere.

What is claimed is:

1. A reflective optical element for the extreme ultraviolet and/or soft x-ray wavelength range comprising: a multilayer system having a surface and periodic repetitions of spacer and absorber layers, and a cover layer system covering the multilayer system and having at least one layer to protect the surface, wherein, when a spatial structure of the cover layer system is described in a Cartesian system of coordinates (x, y, z) with z=z(x, y), a thickness distribution d=d(x, y) of at least one layer of the cover layer system as a function of its spatial coordinates has a gradient not equal to zero, wherein the thickness distribution of the cover layer system in at least one direction relative to the xy-coordinates varies monotonically with the intensity distribution along the beam cross section of the operating incident radiation.

2. The reflective optical element according to claim 1, wherein the thickness distribution is such that the convolution, in respect of the xy-coordinates, of the intensity distribution along the beam cross section of the operating incident radiation with the electrical field intensity of the standing wave formed by reflection at the free boundary surface and normalized to the incident radiation intensity (the degradation profile) produces a linear distribution.

3. The reflective optical element according to claim 1, wherein the thickness distribution is such that the convolution, in respect of the xy-coordinates, of the intensity distribution along the beam cross section of the operating incident radiation with the electrical field intensity of the standing wave formed by reflection at the free boundary surface and normalized to the incident radiation intensity (the degradation profile) produces a rotationally symmetrical distribution.

4. The reflective optical element according to claim 1, wherein the thickness distribution is such that the convolution, in respect of the xy-coordinates, of the intensity distribution along the beam cross section of the operating incident radiation with the electrical field intensity of the standing wave formed by reflection at the free boundary surface and normalized to the incident radiation intensity (the degradation profile) produces a superpositioning of a linear and a rotationally symmetrical distribution.

5. The reflective optical element according to claim 2, wherein the distribution resulting from the convolution in terms of the xy-coordinates is such that the magnitude of the distribution decreases at every point (x, y) of the surface with increasing thickness of the cover layer system.

6. The reflective optical element according to claim 1, wherein the layer protecting the surface defines a free boundary surface and wherein the thickness distribution is such that the weighted product, in respect of the xy-coordinates, of the intensity distribution along the beam cross section of the operating incident radiation and the electrical field intensity of the standing wave formed by reflection at the free boundary surface and normalized to the incident radiation intensity (the degradation profile) yields a linear distribution.

7. The reflective optical element according to claim 1, wherein the layer protecting the surface defines a free boundary surface and wherein the thickness distribution is such that the weighted product, in respect of the xy-coordinates, of the intensity distribution along the beam cross section of the operating incident radiation and the electrical field intensity of the standing wave formed by reflection at the free boundary surface and normalized to the incident radiation intensity (the degradation profile) yields a rotationally symmetrical distribution.

8. The reflective optical element according to claim 1, wherein the layer protecting the surface defines a fret; boundary surface and wherein the thickness distribution is such that the weighted product, in respect of the xy-coordinates, of the intensity distribution along the beam cross section of the operating incident radiation and the electrical field intensity of the standing wave formed by reflection at the free boundary surface and normalized to the incident radiation intensity (the degradation profile) yields a superpositioning of a linear and a rotationally symmetrical distribution.

9. The reflective optical element according to claim 6, wherein the distribution resulting from the weighted product in terms of the xy-coordinates is such that the magnitude of this distribution decreases at every point (x, y) of the surface with increasing thickness of the cover layer system.

10. An EUV lithography appliance, comprising: at least two reflective optical elements for the extreme ultraviolet and/or soft x-ray wavelength range, each with a multilayer system having a periodic repetition of spacer and absorber layers and at least one cover layer system covering the multilayer system, wherein the cover layer systems have different materials, or different thickness distributions in the z-direction as a function of the x or y-coordinates, or x and y-coordinates, or a combination thereof, and the thickness distribution of at least one layer of one cover layer system has a gradient not equal to zero.

11. The EUV lithography appliance according to claim 10, wherein an overall thickness of the cover layer system is at most 8 nm.

12. The EUV lithography appliance according to claim 10, wherein a maximum change in thickness of the cover layer system is at most 3 nm.

13. An EUV lithography appliance, comprising: at least two reflective optical elements for the extreme ultraviolet and/or soft x-ray wavelength range, each with a multilayer system having a periodic repetition of spacer and absorber layers and at least one cover layer system covering the multilayer system, wherein the cover layer system has at least one outer layer and one layer lying underneath, and the cover layer systems have different materials, or different thickness distributions in the z-direction as a function of the x or y-coordinates, or x and y-coordinates, or a combination thereof, and the thickness distribution of at least the layer of a cover layer system lying underneath has a gradient not equal to zero.

14. The reflective optical element according to claim 3, wherein the distribution resulting from the convolution in terms of the xy-coordinates is such that the magnitude of the distribution decreases at every point (x, y) of the surface with increasing thickness of the cover layer system.

15. The reflective optical element according to claim 4, wherein the distribution resulting from the convolution in terms of the xy-coordinates is such that the magnitude of the distribution decreases at every point (x, y) of the surface with increasing thickness of the cover layer system.

16. The reflective optical element according to claim 7, wherein the distribution resulting from the weighted product in terms of the xy-coordinates is such that the magnitude of this distribution decreases at every point (x, y) of the surface with increasing thickness of the cover layer system.

17. The reflective optical element according to claim 8, wherein the distribution resulting from the weighted product in terms of the xy-coordinates is such that the magnitude of this distribution decreases at every point (x, y) of the surface with increasing thickness of the cover layer system.

* * * * *

UNITED STATES PATENT AND TRADEMARK OFFICE
CERTIFICATE OF CORRECTION

PATENT NO.        : 8,633,460 B2                                Page 1 of 1
APPLICATION NO.   : 13/180263
DATED             : January 21, 2014
INVENTOR(S)       : Marco Wedowski It is certified that error appears in the above-identified patent and that said Letters Patent is hereby corrected as shown below:

On the Title Page, Item (54) and in the Specification, Column 1, Line 1-2, Title: delete "Reflective optical element, optical system EUV and lithography device" and insert -- Reflective optical element, optical system and EUV lithography device --

In the Claims

Column 11, Line 18: In Claim 16: delete "this distribution" and insert -- the distribution --

Column 11, Line 23: In Claim 17: delete "this distribution" and insert -- the distribution --

Signed and Sealed this
Twenty-ninth Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,633,460 B2  
APPLICATION NO. : 13/180263  
DATED : January 21, 2014  
INVENTOR(S) : Marco Wedowski Page 1 of 1

It is certified that error appears in the above-identified patent and that said Letters Patent is hereby corrected as shown below:

On the Title Page
Abstract, Line 2: delete "soft X-ray range" and insert -- soft X-ray wavelength range --

In the Specification
Column 2, Line 65: delete "machine" and insert -- appliance --
Column 3, Line 67: delete "machines" and insert -- appliances --
Column 4, Line 16: delete "I ((x,y)" and insert -- I (x,y) --
Column 6, Line 5: delete "FIG. 1a-c" and insert -- FIGS. 1a-c --
Column 7, Line 17: delete "x-direction;" and insert -- x-direction. --

In the Claims
Column 10, Line 28: In Claim 8: delete "fret," and insert -- free --
Column 11, Line 11: In Claim 15: delete "the distribution" and insert -- this distribution --

Signed and Sealed this
Twenty-first Day of October, 2014

Michelle K. Lee
*Deputy Director of the United States Patent and Trademark Office*